United States Patent [19]

Sood

[11] Patent Number: 4,549,101
[45] Date of Patent: Oct. 22, 1985

[54] CIRCUIT FOR GENERATING TEST EQUALIZATION PULSE

[75] Inventor: Lal C. Sood, Austin, Tex.

[73] Assignee: Motorola, Inc., Schaumburg, Ill.

[21] Appl. No.: 556,761

[22] Filed: Dec. 1, 1983

[51] Int. Cl.[4] .................... H03K 5/04; H03K 17/693
[52] U.S. Cl. .................................. 307/443; 307/265;
324/73 R; 365/201; 365/233
[58] Field of Search ............... 307/443, 449, 468, 470,
307/481–482, 234, 265, 269, 597, 590–592, 603,
605; 324/73 R, 73 AT; 328/63, 74, 129.1;
364/579; 365/195, 201, 202, 233; 371/21

[56] References Cited

U.S. PATENT DOCUMENTS

| | | | |
|---|---|---|---|
| 4,439,727 | 3/1984 | Boyle | 324/73 R X |
| 4,450,515 | 5/1984 | Takemae et al. | 307/297 X |
| 4,465,973 | 8/1984 | Countryman, Jr. | 324/73 R X |
| 4,489,247 | 12/1984 | Ikeda et al. | 307/477 |
| 4,495,642 | 1/1985 | Zellmer | 324/73 AT X |
| 4,503,339 | 3/1985 | Tsuge et al. | 307/296 R |

OTHER PUBLICATIONS

Thoma, "Strobe-Controlled Data Output Circuit", IBM Tech Disc Bull, vol. 22, No. 3, Aug. 1979, pp. 941–942.

Primary Examiner—Stanley D. Miller
Assistant Examiner—D. R. Hudspeth
Attorney, Agent, or Firm—Anthony J. Sarli, Jr.; Jeffrey Van Myers; James L. Clingan, Jr.

[57] ABSTRACT

A circuit for generating an equalization pulse for test purposes uses an equalization pulse generator which generates an equalization pulse in response to receiving one or more address transition signals generated from an address transition. The address transition signals are received by a multi-input logic circuit which causes the equalization pulse to be present at least as long as a signal is present at one of the inputs. A test pad on the integrated circuit receives an externally generated test signal of variable duration. The test signal is coupled to an input of the logic circuit to generate the equalization pulse for the duration of the test signal.

10 Claims, 4 Drawing Figures

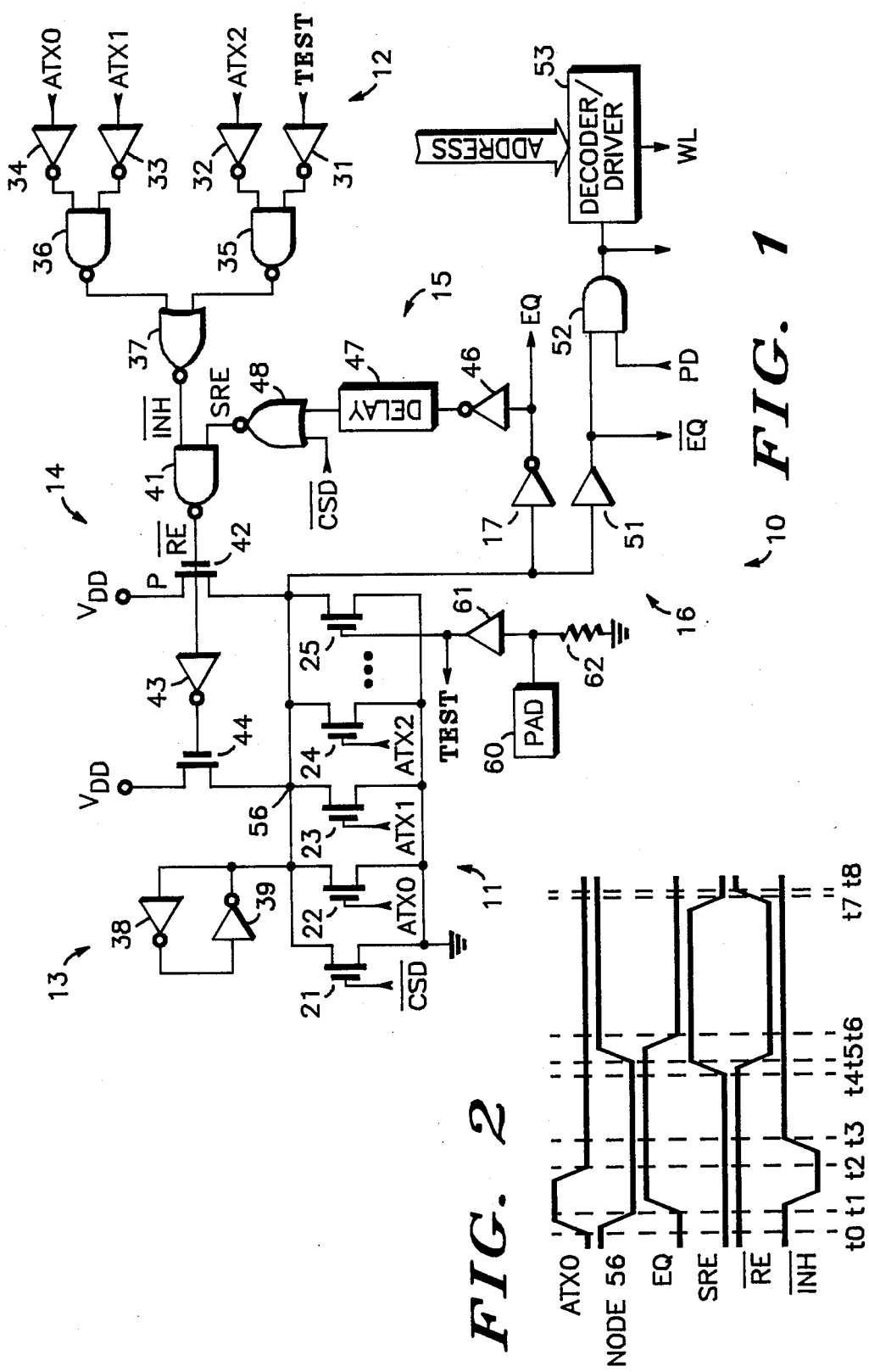

4,549,101

CIRCUIT FOR GENERATING TEST EQUALIZATION PULSE

CROSS-REFERENCE TO RELATED APPLICATIONS

Related subject matter is disclosed in U.S. patent application No. 556,759 entitled "Address Transition Pulse Circuit" filed simultaneously herewith and assigned to the assignee hereof.

BACKGROUND OF THE INVENTION

The subject invention relates to testing pulse generators and more particularly, to testing pulse generators responsive to address transition in a memory circuit.

Address transition detection has been found to be useful in improving the speed-power product for memories, particularly static random access memories (SRAMs). One of the primary uses of address transition detection is to equalize the voltage on pairs of bit lines just prior to sensing data. An equalization pulse is generated in response to detecting an address transition. While the equalization pulse must be of sufficient duration to equalize the bit lines, it is desirable for the equalization pulse to be as short in duration as possible to minimize access time. Accordingly, for a given memory there is an optimum pulse width for the equalization pulse.

Such optimum pulse width can be estimated with modelling techniques. The actual pulse width produced in a device may differ from that desired. Because it may be a relatively narrow pulse, 10-20 nanoseconds, the design can be quite critical. A slight design or modelling error can result in a pulse so narrow as to not actually equalize the bit lines, or worse, result in no pulse at all. Obviously such a design requires correction before production can be started. Nonetheless, it is still desirable to be able to test other aspects of the memory for design defects so that as many design corrections as possible can be made at the same time. The time from a design correction to a device that can be tested is typically six weeks.

The equalization pulse circuitry is a relatively small portion of the memory. Consequently, to only be able to discover that the equalization pulse circuitry requires a design correction, leaves the vast majority of the device untested. If, however, the equalization pulse is of a longer duration than optimum, the rest of the memory can typically be effectively tested. Other design defects than those of the equalization pulse circuitry can then be corrected. Consequently, the consequences of no pulse or one too short to be able to equalize the bit lines sufficiently to read data are more severe than when the pulse is longer than optimum.

SUMMARY OF THE INVENTION

An object of the subject invention is to provide improved means for testing a memory with an equalization circuit.

Another object of the invention is to provide an equalization pulse in response to an external signal for improved testing of the design of an integrated circuit which includes a circuit for generating a pulse in response to an address transition.

Yet another object of the subject invention is to provide an improved address transition pulse circuit for generating a pulse in response to an external signal.

These and other objects of the invention are achieved in an integrated circuit which includes a circuit for generating a pulse responsive to address transition signals generated from respective address transitions. The address transition signals are of a shorter duration than the duration intended for the pulse. A test pad is provided on the integrated circuit to receive an external test signal of variable duration. Circuitry coupled to the test pad provides the pulse for the duration of the external test signal.

BRIEF DESCRIPTION OF THE DRAWINGS

FIG. 1 is a circuit diagram of an address transition pulse circuit according to a preferred embodiment of the invention;

FIG. 2 is a timing diagram of signals of the circuit of FIG. 1 for a first timing sequence;

DESCRIPTION OF THE INVENTION

Figure 3:
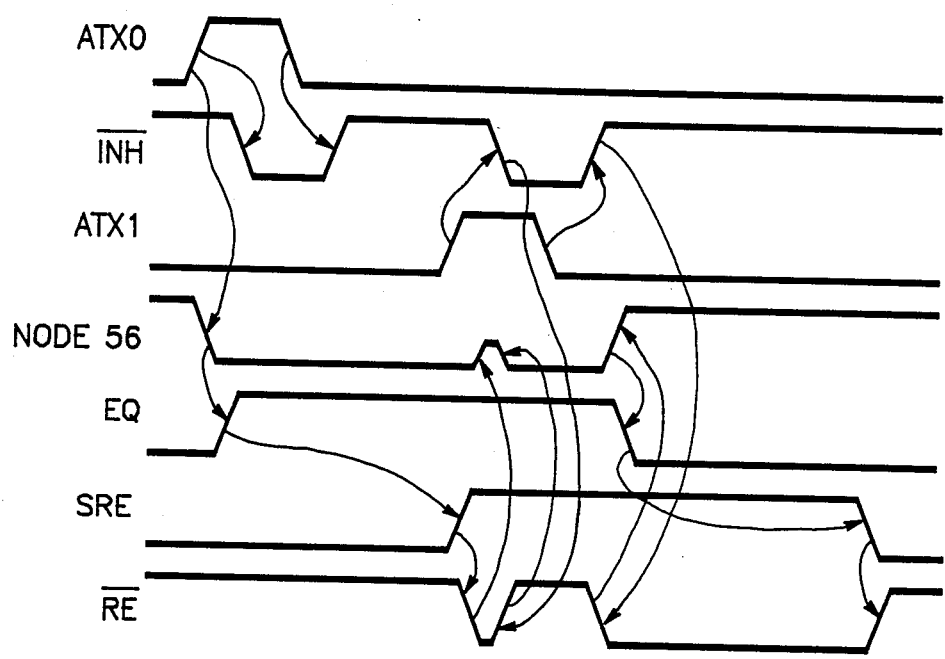
FIG. 3 is a timing diagram of signals of the circuit of FIG. 1 for a second timing sequence.

Shown in FIG. 1 is an address change initiated clock circuit 10 comprised generally of a transition NOR circuit 11, a transition NOR logic circuit 12, a latch 13, a charging circuit 14, a delay circuit 15, a decoder/driver logic circuit 16, and an inverter 17. NOR circuit 11 is comprised of a transistor 21, a transistor 22, a transistor 23, a transistor 24, and a transistor 25. NOR logic circuit 12 is comprised of an inverter 31, an inverter 32, an inverter 33, an inverter 34, a NAND gate 35, a NAND gate 36, and a NOR gate 37. Latch 13 is comprised of an inverter 38 and an inverter 39. Charging circuit 14 comprises a NAND gate 41, a P channel transistor 42, an inverter 43, and a transistor 44. Delay circuit 15 is comprised of an inverter 46, a time delay 47, and a NOR gate 48. Decoder/driver logic circuit 16 is comprised of a buffer 51, and AND gate 52, and a decoder/driver 53. For the embodiment shown transistors 21-25 and 44 are N channel, enhancement-mode, insulated gate field effect transistors with a threshold voltage of 0.8 to 1.1 volts. Transistor 42 is a P channel, enhancement-mode, insulated gate field effect transistor with a threshold voltage of −0.8 to −1.1 volts. Logic gates and inverters 31-39, 41 and 43, 46 and 48, 51-52, and 61 are all CMOS.

Transistors 21-25 each have a drain connected to a node 56, and a source connected to ground. Transistor 21 has a gate for receiving an inverted chip select delayed signal $\overline{CSD}$. Transistor 22 has a gate for receiving an address transition signal ATX0. Transistor 23 has a gate for receiving an address transition signal ATX1. transistor 24 has a gate for receiving an address Transition signal ATX2. Transistor 25 has a gate for receiving a test signal TEST.

Inverter 31 has an input for receiving signal TEST, and an output. Inverter 32 has an input for receiving signal ATX2, and an output. Inverter 33 has an input for receiving signal ATX1, and an output. Inverter 34 has an input for receiving signal ATX0, and an output. NAND gate 35 has a first input connected to the output of inverter 31, and a second input connected to the output of inverter 32, and an output. NAND gate 36 has a first input connected to the output of inverter 34, and a second input connected to the output of inverter 33, and an output. NOR gate 37 has a first input connected to the output of NAND gate 35, a second input connected to the output of NAND gate 36, and an output. Inverter 38 has an input connected to node 56, and an output. Inverter 39 has an input connected to the output of inverter 38, and an output connected to node 56.

Inverter 17 has an input connected to node 56, and an output for providing equalization signal EQ. Inverter 46 has an input connected to the output of inverter 17, and an output. Delay 47 has an input connected to the output of inverter 46, and an output. NOR gate 48 has a first input connected to the output of delay 47, a second input for receiving signal $\overline{CSD}$, and an output. NAND gate 41 has a first input connected to the output of NOR gate 37, a second input connected to the output of NOR gate 48, and an output. Transistor 42 has a gate connected to the output of NAND gate 41, a drain connected to node 56, a source connected to a positive power supply terminal $V_{DD}$ for receiving, for example, 5 volts. Inverter 43 has an input connected to the output of NAND gate 41, and an output. Transistor 44 has a gate connected to the output of inverter 43, a drain connected to $V_{DD}$, and a source connected to node 56.

Buffer 51 has an input connected to node 56, and an output. AND gate 52 has a first input connected to the output of amplifier 51, a second input for receiving a pre-decoded signal PD, and an output. Decoder/driver 53 has a first signal input connected to the output of AND gate 52, a bus input for receiving an address, and an output for providing a signal WL to a word line (not shown).

Signals ATX0-ATX2 are signals which switch from a logic low to a logic high for a short duration, for example 6 nanoseconds, in response to a transition of a corresponding address signal. Typical address signals A0, A1, and A2 of a memory could correspond to signals ATX0, ATX1, and ATX2, respectively. Additional address signals could also have corresponding address transition signals for generating an equalization pulse. Transition NOR circuit 11 and transition NOR logic 12 could both be expanded to have more inputs to accommodate additional address transition signals.

In operation circuit 10 provides signal EQ for the purpose of equalizing and/or precharging bit lines (not shown). Latch 13 sustains the logic level which is present at node 56. Inverters 38 and 39 of latch 13 have a relatively small gain so that node 56 can be switched from one state to another. Assuming as an initial condition that node 56 is being sustained by latch 13 at a logic high at or near 5 volts, signal EQ will be provided by inverter 17 at a logic low. Inverter 46 and delay 47 provide a standard reset signal SRE at a logic high to NOR gate 48 which causes NOR gate 48 to provide a logic low to NAND gate 41. With NAND gate 41 receiving a logic low, NAND gate 41 provides a complementary reset signal $\overline{RE}$ at a logic high to P channel transistor 42 and inverter 43. Inverter 43 provides a logic low to N channel transistor 44. Consequently, transistors 42 and 44 are both off. When signal $\overline{RE}$ is a logic high, both transistors 42 and 44 are turned off. Conversely, when signal $\overline{RE}$ is a logic low, both transistors 42 and 44 are conducting. NOR circuit 12 provides an inhibit signal $\overline{INH}$ to NAND gate 41 at a logic high while signals ATX0-ATX2 and TEST are a logic low. When one of the signals ATX0-ATX2 switches to a logic high, signal $\overline{INH}$ will switch to a logic low a small time duration, for example 3 nanoseconds, later. The delay is caused by three propagation delays. Inverters 31-34 is a first stage, NAND gates 35 and 36 form a second stage, and NOR gate 37 forms a third stage.

When signal $\overline{INH}$ switches to a logic low, NAND gate 41 is forced to provide signal $\overline{RE}$ at a logic high, ensuring that transistors 42 and 44 are turned off. NOR circuit 12 is for inhibiting transistors 42 and 44 in response to receiving one or more of signals ATX0-ATX2.

With node 56 at a logic high, the output of buffer 51 is also a logic high so that AND gate 52 provides an output of the same logic state as that of signal PD. If signal PD is a logic high, then decoder/driver 53 will respond to the address. If the address selects decoder/driver 53, then signal WL will be a logic high for enabling the word line to which it corresponds. Signal $\overline{EQ}$ is coupled to other AND gates (not shown) which receive other predecoded signals (not shown). The output of AND gate 52 is coupled to other decoder/drivers (not shown). The effect is that when signal $\overline{EQ}$ is a logic high, a word line is selected based on the address signals received. When signal $\overline{EQ}$ is a logic low, all word lines are deselected. All word lines are thus deselected during equalization which is when signal EQ is high and signal $\overline{EQ}$ is low.

To obtain an equalization pulse, signal EQ at a logic high for about a 12 nanosecond duration, one or more of signals ATX0-ATX2 switches to a logic high. Shown in FIG. 2 is a timing diagram which shows signal ATX0 switching to a logic high beginning at a time $t_0$. Node 56 then switches to a logic low causing inverter 17 to begin to switch signal EQ to a logic high at time $t_1$. It is assumed that signal EQ had been at a logic low sufficiently long that delay 47, receiving a logic high from inverter 46, was providing a logic high output. ATX0 switching to a logic high causes signal $\overline{INH}$ to switch to a logic low at the predetermined delay time following the rise of signal ATX0. Signal $\overline{INH}$ has no effect because signal SRE at a logic low is already causing NAND gate 41 to provide signal $\overline{RE}$ at a logic high. Signal $\overline{INH}$ remains at a logic low for essentially the same time duration that signal ATX0 remains at a logic high. After signal ATX0 has switched back to a logic low at time $t_2$, node 56 remains at a logic low due to latch 13. Signal $\overline{INH}$ is switched back to a logic high by time $t_3$. After the predetermined delay time from time $t_0$, delay 47 provides a logic low to NOR gate 48 which in turn causes signal SRE to begin switching to a logic high at time $t_4$. In response NAND gate 41 switches to a logic low, turning on transistors 42 and 44, causing node 56 to begin switching to a logic high at a time $t_5$. In response to node 56 switching to a logic high, signal EQ switches from a logic high to a logic low by a time $t_6$. After the predetermined time delay, signal SRE switches from a logic high to a logic low by a time $t_7$. Signal SRE switching to a logic low causes signal $\overline{RE}$ to switch to a logic high by a time $t_8$. Following time $t_8$, the signals of FIG. 2 will remain at the same logic state until another address transition occurs. FIG. 2 shows the situation in which only one address signal changes state, in particular, the address signal which causes signal ATX0 to switch. FIG. 2 also reflects the situation in which other address transition signals, for example signals ATX1 and ATX2, occur at nearly the same time as signal ATX0. For such a situation, the duration of the equalization pulse, signal EQ at a logic high, is determined by the delay of delay 47. Using delay 47 in a feedback loop to actively reset node 56 makes for a relatively fast rise time which is advantageous because the threshold of inverter 17 is then relatively insignificant in determining the duration of the equalization pulse.

Another situation, shown in FIG. 3, which can occur is when an address transition occurs just before delay 47 causes signal SRE to switch to a logic high. Signal EQ switches to a logic high in the same way as was described for FIG. 2. Causation arrows are included in FIGS. 3 and 4 to aid in understanding the relationship of the various signals. Signal ATX0 switches to a logic high which causes node 56 to switch to a logic low, which in turn causes signal EQ to switch to a logic high. Just before signal SRE switches to a logic high, signal ATX1 begins switching to a logic high. Because node 56 is already at a logic low, node 56 is unaffected by signal ATX1 switching to a logic high. Signal SRE switches to a logic high causing signal $\overline{RE}$ to switch to a logic low. Signal RE at a logic low tends to drive node 56 to a logic high. Node 56, however, does not actually reach a sufficiently high voltage for inverter 17 to recognize it as a logic high. Consequently, signal EQ remains at a logic high. This is the desirable result. Signal EQ has already been high for sufficiently long to equalize the bit lines but it is desirable for the bit lines to remain equalized until the address is no longer in transition. That the voltage level at node 56 is recognized as a logic low is achieved by ratioing the gains of transistors 22–24 versus transistors 42 and 44 to ensure that a predetermined voltage, for example, 2 volts will not be exceeded while also adjusting the threshold of inverter 17 to ensure that the predetermined voltage will be recognized as a logic low. An undesirable effect at this point is that there is a current drain. One of transistors 22–24 is turned on while transistors 42 and 44 are turned on. This undesirable current drain is terminated quickly by signal $\overline{INH}$. Signal $\overline{INH}$ switches to a logic low after the delay time from signal ATX1 switching to a logic high, causing signal $\overline{RE}$ to switch to a logic high which then turns off transistors 42 and 44. Consequently the current drain is for a very short time duration. When signal ATX1 switches to a logic low, node 56 remains at a logic low because signal $\overline{INH}$ causes signal $\overline{RE}$ to remain at a logic high. When signal $\overline{INH}$ switches to a logic high, signal $\overline{RE}$ responds by switching to a logic low, causing node 56 to switch to a logic high. Node 56 switching to a logic high causes signal EQ to switch to a logic low, terminating the equalization pulse. Signal SRE then subsequently switches to a logic low, causing signal $\overline{RE}$ to switch to a logic high so that node 56 is held at a logic high by latch 13. Circuit 10 thus extends the equalization pulse, the duration of signal EQ at a logic high, due to ATX1 at a logic high and then $\overline{INH}$ at a logic low for the situation described.

Figure 4:
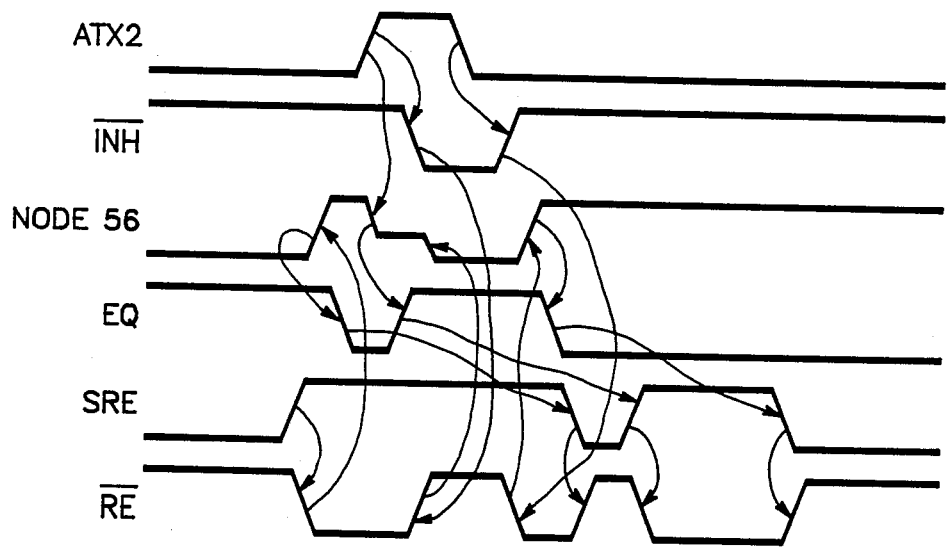
FIG. 4 is a timing diagram of signals of the circuit of FIG. 1 for a third timing sequence.

Another situation, shown in FIG. 4, which is of concern is when an address transition occurs after the signal EQ has switched to a logic low but before signal $\overline{RE}$ has switched to a logic high. The first transition shown in FIG. 4 is signal SRE switching to a logic high. The sequence begins the same as that beginning at time $t_4$ of FIG. 2. Signal SRE switches to a logic high as determined by the time delay 47 for the purpose of terminating the equalization pulse, switching signal EQ to a logic low. Signal SRE switching to a logic high causes signal $\overline{RE}$ to switch to a logic low, which in turn causes node 56 to switch to a logic high, which in turn causes signal EQ to switch to a logic low. Instead of a normal access of a memory cell now occurring, another address transition occurs. FIG. 4 shows signal ATX2 switching to a logic high to depict the address transition. Signal ATX2 switching to a logic high causes node 56 to drop sufficiently in voltage to be recognized as a logic low by inverter 17. As described before, the voltage at node 56 is higher than if transistors 42 and 44 were turned off but nonetheless sufficiently low to be recognized as a logic low. Consequently, signal EQ switches to a logic high which is desirable because it is desirable to equalize the bit lines in view of the address transition as indicated by signal ATX2 switching to a logic high. There is again, however, the undesirable current drain associated with signal $\overline{RE}$ being at a logic low concurrently with one of signals ATX0–ATX2 being a logic high. Signal $\overline{INH}$ switching to a logic low, however, causes signal $\overline{RE}$ to switch to a logic high to turn off transistors 42 and 44, and thereby quickly terminating the current drain. Signal $\overline{INH}$ switching back to a logic high causes signal $\overline{RE}$ to switch to a logic low because signal SRE is still a logic high. Consequently node 56 switches to a logic high, causing signal EQ to switch to a logic low. Signal SRE may subsequently switch to a logic low, which will cause signal $\overline{RE}$ to switch to a logic high but will not cause any change to node 56 and therefore not affect signal EQ. Although signal EQ is at a logic high for a shorter time than that for the situation of FIG. 2, the shorter duration is sufficient to fulfill the purpose of generating an equalization pulse. The shorter duration equalization pulse occurs only in this case of FIG. 4 where the address transition occurs before signal SRE has switched to a logic low following signal EQ switching to a logic low. Consequently the shorter equalization pulse will occur only a few nanoseconds after the termination of the previous equalization pulse. This is acceptable because the bit lines were already equalized due to the previous address transition. During this time word lines may or may not get selected. If the word line did get selected, the bit line would separate only very little in voltage, causing little or no degradation in performance.

Another aspect of circuit 10 is a test feature. Signal EQ can be generated in response to an external test signal received on a pad 60. Pad 60 is connected to an input of a buffer 61, and a first terminal of a resistor 62. A second terminal of resistor 62 is connected to ground. Buffer 61 has an output which provides signal TEST. If no signal is present on pad 60, the input of buffer 61 is held to ground which causes buffer 61 to provide signal TEST at a logic low. With signal TEST at a logic low, transistor 25 is turned off and inverter 31 does not affect NOR circuit 12. When pad 60 receives a signal at a logic high, transistor 25 will turn on, causing the generation of an equalization pulse, signal EQ at a logic high, and NOR circuit 12 will cause transistors 42 and 44 to turn off in the same manner as for signals ATX0–ATX2. Signal EQ will remain at a logic high at least until signal TEST switches to a logic low. Signal EQ can remain at a logic high longer than signal TEST is at a logic high as caused by delay 47 in the same way as for responding to signals ATX0–ATX2.

The purpose of generating signal TEST is primarily to allow for experimentation before design is finalized. The actual pulse width of signal EQ obtained after a first design effort may differ from that desired. A slight design or modelling error can result in a pulse width so narrow as to be insufficient for equalizing the bit lines, or worse, result in no pulse at all. This can happen if, for example, the time delay of delay 47 is too short, in which case signal TEST can be used to obtain an equalization pulse of the desired duration. Pad 60 is made conveniently available for application of signals. Pad 60 can be, for example, substantially the same as a conventional bonding pad which is convenient for applying signals for experimentation purposes.

When the chip is deselected signal $\overline{CSD}$ is a logic high, causing transistor 21 to turn on which pulls node 56 to a logic low which in turn causes signal EQ to be a logic high. Consequently when the chip is deselected, the bit lines are equalized. Signal $\overline{CSD}$ at a logic high causes signal SRE to be at a logic low which ensures that transistors 42 and 44 are turned off. This prevents the current drain from transistors 42 and 44 through transistor 21. When the chip is selected, signal $\overline{CSD}$ is delayed from switching to a logic low. This delay is adjusted to match with the delay through the address buffers. The first stage of these address buffers being powered up and down by a signal $\overline{CS}$ (not shown) which is internally generated. By delaying and creating signal $\overline{CSD}$, it is assured that the associated equalization circuitry will not initiate a spurious pulse because of the forced state of address buffers imposed by signal $\overline{CS}$ in the deselected mode.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

I claim:

1. In an integrated circuit which includes a circuit for generating an equalization pulse in response to receiving one or more address transition signals on a multi-input logic circuit, wherein the equalization pulse will be present at least as long as a signal is present at an input of the logic circuit, an improvement comprising:
   a test pad on the integrated circuit for receiving an external test signal; and
   coupling means for coupling the test signal to an input of the logic circuit, wherein the test signal causes generation of the equalization pulse.

2. The integrated circuit of claim 1 wherein the logic circuit provides a transition from a second logic level to a first logic level at a common node whenever a signal is present on an input.

3. The integrated circuit of claim 2 further comprising:
   delay means coupled to the common node for providing a delayed signal in response to the common node switching from the second logic level to the first logic level, the delayed signal occurring a predetermined time duration following the switching of the common node;
   charging means coupled to the logic means and to the delay means for supplying current to the common node to drive the common node to the second logic level in response to receiving the delayed signal;
   inhibit means coupled to the charging means and the coupling means for receiving the address transition signals and the test signal and for inhibiting the charging means from supplying current to the common node in response to receiving one or more of the test signal and address transition signals; and
   output means coupled to the common node for providing the equalization pulse in response to the logic state of the common node.

4. The integrated circuit of claim 3 wherein the inhibit means comprises:
   a NOR gate, which has a predetermined time delay which is less than the predetermined time duration of the delay means, having inputs for receiving the address transition signals and the test signal, and an output; and
   a NAND gate having a first input coupled to the output of the NOR gate, a second input for receiving the delayed signal, and an output coupled to the charging means.

5. The integrated circuit of claim 4 wherein the charging means comprises:
   a P channel transistor having a first current electrode coupled to a first power supply terminal, a second current electrode coupled to the common node, and a control electrode coupled to the output of the NAND gate;
   an inverter having an input coupled to the output of the NAND gate, and an output; and
   an N channel transistor having a first current electrode coupled to the first power supply terminal, a second current electrode coupled to the common node, and a control electrode coupled to the output of the inverter.

6. The integrated circuit of claim 5 wherein the logic means comprises a plurality of transistors each having a first current electrode coupled to the common node, a second current electrode coupled to a second power supply terminal, and a control electrode for receiving a corresponding address transition signal or test signal.

7. The integrated circuit of claim 6 further comprising latch means coupled to the common node for sustaining the logic state present on the common node when all of said plurality of transistors, the N channel transistor, and the P channel transistor are turned off.

8. The integrated circuit of claim 7 wherein the coupling of the delay means to the common node is achieved via the output means.

9. In an integrated circuit which has a circuit for generating an equalization pulse in response to an address transition, a method comprising the steps of:
   receiving a signal of variable duration which is generated externally from the integrated circuit; and
   providing the equalization pulse for the duration of said signal.

10. In an integrated circuit which includes a circuit for generating a pulse responsive to address transition signals generated from respective address transitions, wherein the address transition signals are of a shorter duration than the duration intended for the pulse, an improvement comprising:
    a test pad on the integrated circuit for receiving an external test signal of variable duration; and
    means coupled to the test pad for generating and sustaining the pulse for the duration of the external test signal.

* * * * *